United States Patent
Sugiyama et al.

(10) Patent No.: US 10,483,459 B2
(45) Date of Patent: Nov. 19, 2019

(54) MAGNETIC MEMORY

(71) Applicant: KABUSHIKI KAISHA TOSHIBA, Minato-ku (JP)

(72) Inventors: Hideyuki Sugiyama, Kawasaki (JP); Yuichi Ohsawa, Yokohama (JP); Satoshi Shirotori, Yokohama (JP); Mariko Shimizu, Setagaya (JP); Altansargai Buyandalai, Kawasaki (JP); Hiroaki Yoda, Kawasaki (JP)

(73) Assignee: KABUSHIKI KAISHA TOSHIBA, Minato-ku (JP)

(*) Notice: Subject to any disclaimer, the term of this patent is extended or adjusted under 35 U.S.C. 154(b) by 0 days.

(21) Appl. No.: 15/914,206

(22) Filed: Mar. 7, 2018

(65) Prior Publication Data
US 2019/0051820 A1 Feb. 14, 2019

(30) Foreign Application Priority Data
Aug. 8, 2017 (JP) .................. 2017-152934

(51) Int. Cl.
*G11C 11/16* (2006.01)
*H01L 43/08* (2006.01)
(Continued)

(52) U.S. Cl.
CPC ............ *H01L 43/08* (2013.01); *G11C 11/161* (2013.01); *G11C 11/1673* (2013.01);
(Continued)

(58) Field of Classification Search
CPC ....................................................... G11C 11/16
(Continued)

(56) References Cited

U.S. PATENT DOCUMENTS 6,473,336 B1   10/2002   Nakajima et al.
7,206,220 B2   4/2007    Ditewig et al.
(Continued)

FOREIGN PATENT DOCUMENTS

JP   2005-526351 A   9/2005
JP   3868699          1/2007
(Continued)

*Primary Examiner* — Jason Lappas
(74) *Attorney, Agent, or Firm* — Oblon, McClelland, Maier & Neustadt, L.L.P.

(57) ABSTRACT

A magnetic memory according to an embodiment includes: a first conductive layer including a first to third regions arranged along a first direction, the second region being disposed between the first region and the third region; a second conductive layer including a fourth to sixth regions arranged along the first direction, the fifth region being disposed between the fourth and sixth regions; a third conductive layer electrically connected to the third and fourth regions; a first magnetoresistance device disposed to correspond to the second region, including a first magnetic layer, a second magnetic layer, and a first nonmagnetic layer; a second magnetoresistance device to correspond to the fifth region, including a third magnetic layer, a fourth magnetic layer, and a second nonmagnetic layer, a direction from the first region to the third region differing from a direction from the fourth region to the sixth region.

12 Claims, 11 Drawing Sheets

(51) Int. Cl.
  *H01L 43/02*   (2006.01)
  *H01L 27/22*   (2006.01)
  *G11C 11/18*   (2006.01)
  *H01L 43/10*   (2006.01)
(52) U.S. Cl.
  CPC .......... *G11C 11/1675* (2013.01); *G11C 11/18* (2013.01); *H01L 27/228* (2013.01); *H01L 43/02* (2013.01); *H01L 43/10* (2013.01)
(58) Field of Classification Search
  USPC ........................................................ 365/158
  See application file for complete search history.

(56) References Cited

U.S. PATENT DOCUMENTS

| | | | |
|---|---|---|---|
| 8,243,502 B2 | 8/2012 | Sakimura et al. | |
| 2006/0067111 A1* | 3/2006 | Ezaki ..................... | G11C 11/16 365/158 |

FOREIGN PATENT DOCUMENTS

| | | |
|---|---|---|
| JP | 3913971 | 5/2007 |
| JP | 6280195 | 2/2018 |
| WO | WO 2009/078242 A1 | 6/2009 |

* cited by examiner

MAGNETIC MEMORY

CROSS REFERENCE TO RELATED APPLICATIONS

This application is based upon and claims the benefit of priority from the prior Japanese Patent Application No. 2017-152934 filed on Aug. 8, 2017, the entire contents of which are incorporated herein by reference.

FIELD

Embodiments described herein relate generally to magnetic memories.

BACKGROUND

Existing memories may be classified into volatile working memories such as static random access memories (SRAMs) and dynamic random access memories (DRAMs), and nonvolatile storage memories such as NAND flash memories and hard disk drives (HDDs).

The volatile memories operate at a high speed, but have a problem in that the power consumption in the standby mode is large due to the leakage current. In order to solve the problem, various kinds of nonvolatile memories are being studied. Magnetic random access memories (MRAMs), which include magnetoresistance devices, are expected to replace existing working memories since they are nonvolatile and can operate at a high speed.

The MRAMs consume large current and thus large power in write operations since they need to generate a magnetic field in the write operation. This makes it difficult to achieve low-power-consumption devices since even if the standby power consumption of the devices is small, the operating power consumption is large.

Spin transfer torque-MRAMs (STT-MRAMs), which do not need to generate a magnetic field in write operations, may reduce the power consumption. Therefore, memories that use an STT-MRAM as a last level cache (LLC) are expected to consume lower power.

The STT-MRAMs, however, use a single path as both a write current path and a read current path, and therefore have a small read operation margin. The write operation margin of the STT-MRAMs is also small since excessive write current may break the devices.

DETAILED DESCRIPTION

Figure 1:
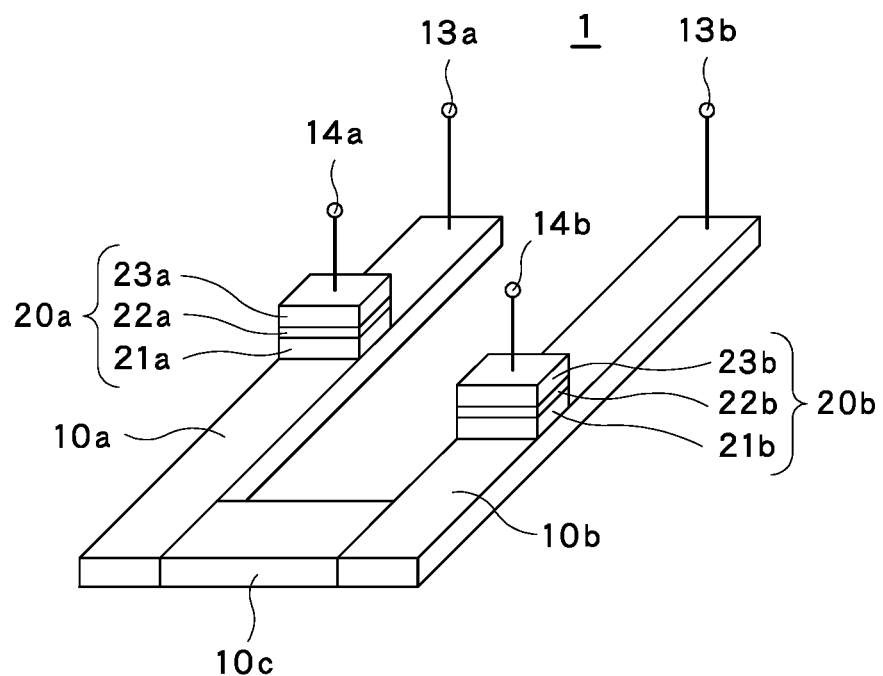
FIG. 1 is a perspective view of a memory cell included in a magnetic memory according to a first embodiment.

Embodiments of the present invention are described in detail below with reference to the accompanying drawings. The drawings, however, are schematic, and the dimensions of each element, the height of each voltage, the length of each period of time, the ratio between elements, the ratio between voltage values, and the intervals between periods of time may be different from the actual ones. The dimensions of each element and the ratio between dimensions of the same element may differ between the drawings.

A magnetic memory according to an embodiment includes: a first terminal and a second terminal; a first conductive layer including a first region, a second region, and a third region that are arranged along a first direction, the second region being disposed between the first region and the third region, and the first region being electrically connected to the first terminal; a second conductive layer including a fourth region, a fifth region, and a sixth region that are arranged along the first direction, the fifth region being disposed between the fourth region and the sixth region, and the sixth region being electrically connected to the second terminal; a third conductive layer electrically connected to the third region and the fourth region; a first magnetoresistance device disposed to correspond to the second region, including a first magnetic layer that is separate from the second region along a second direction that intersects the first direction, a second magnetic layer disposed between the second region and the first magnetic layer and electrically connected to the second region, a first nonmagnetic layer disposed between the first magnetic layer and the second magnetic layer, and a third terminal electrically connected to the first magnetic layer; a second magnetoresistance device disposed to correspond to the fifth region, including a third magnetic layer that is separate from the fifth region along the second direction, a fourth magnetic layer disposed between the fifth region and the third magnetic layer and electrically connected to the fifth region, a second nonmagnetic layer disposed between the third magnetic layer and the fourth magnetic layer, and a fourth terminal electrically connected to the third magnetic layer; and a first circuit configured to flow a current between the first terminal and the second terminal through the first conductive layer, the third conductive layer, and the second conductive layer in a write operation, a direction from the first region to the third region differing from a direction from the fourth region to the sixth region, and a direction from the second magnetic layer to the fourth magnetic layer intersecting a plane including the first direction and the second direction.

The direction from the first region to the third region means a direction from a center of gravity of the first region to a center of gravity of the third region, and the direction from the fourth region to the sixth region means a direction from a center of gravity of the fourth region to a center of gravity of the sixth region, and the direction from the second magnetic layer to the fourth magnetic layer means a direction from a center of gravity of the second magnetic layer to a center of gravity of the fourth magnetic layer.

First Embodiment

A magnetic memory according to a first embodiment will be described with reference to FIGS. 1 to 8. The magnetic memory according to the first embodiment includes at least one memory cell, which is shown in FIG. 1. The memory cell 1 includes conductive layers 10a, 10b, and 10c, magnetoresistance devices 20a and 20b, and terminals 13a, 13b, 14a, and 14b.

For example, the conductive layers 10a and 10b are disposed on the same level to be substantially parallel to each other, and the conductive layer 10c is disposed to connect the conductive layer 10a and the conductive layer 10b. The conductive layer 10a corresponds to a first conductive layer, the conductive layer 10b corresponds to a second conductive layer, and a conductive layer 10c corresponds to a third conductive layer. The first conductive layer and the second conductive layer are not necessarily disposed on the same level, but may be disposed at different heights (on different levels) when viewed from the substrate on which the magnetic memory is mounted. For example, they may be disposed in different planes at different heights.

The terminal 13a is electrically connected to the conductive layer 10a, and the terminal 13b is electrically connected to the conductive layer 10b. The state "A is connected to B" means that A may be connected to B directly or through a conductive material. The conductive layer 10a includes a first region, a second region, and a third region, the second region being disposed between the first region and the third region, the first region being electrically connected to the terminal 13a, and the third region being electrically connected to the conductive layer 10c. The conductive layer 10b includes a fourth region, a fifth region, and a sixth region, the fifth region being placed between the fourth region and the sixth region, the sixth region being electrically connected to the terminal 13b, and the fourth region being electrically connected to the conductive layer 10c.

The magnetoresistance device 20a is disposed in the second region of the conductive layer 10a. The magnetoresistance device 20b is disposed in the fifth region of the conductive layer 10b.

The magnetoresistance device 20a has a multilayer structure including a storage layer (second magnetic layer) 21a, in which the magnetization direction may be changed, a nonmagnetic layer (first nonmagnetic layer) 22a, and a reference layer (first magnetic layer) 23a, in which the magnetization direction may not be changed. The state that "magnetization direction may be changed" means that, after a write operation is performed on the magnetoresistance device, the magnetization direction may be changed. The state that "magnetization direction may not be changed" means that, after a write operation is performed on the magnetoresistance device, the magnetization direction is not changed. The reference layer 23a is electrically connected to the terminal 14a, the storage layer 21a is disposed between the reference layer 23a and the second region of the conductive layer 10a, and the nonmagnetic layer 22a is disposed between the reference layer 23a and the storage layer 21a. In the first and the other embodiments and their modifications, the write operation is performed on the storage layer 21a by means of the spin orbit torque (SOT) generated when current flows through the conductive layer 10a. The storage layer 21a therefore is electrically connected to the second region of the conductive layer 10a.

The magnetoresistance device 20b has a multilayer structure including a storage layer (fourth magnetic layer) 21b, in which the magnetization direction may be changed, a nonmagnetic layer (second nonmagnetic layer) 22b, and a reference layer (third magnetic layer) 23b, in which the magnetization direction may not be changed. The reference layer 23b is electrically connected to the terminal 14b, the storage layer 21b is disposed between the reference layer 23b and the fifth region of the conductive layer 10b, and the nonmagnetic layer 22b is disposed between the reference layer 23b and the storage layer 21b. As in the case of the magnetoresistance device 20a, the write operation is performed on the storage layer 21b by means of the SOT generated when current flows through the conductive layer 10b, as will be described later. The storage layer 21b therefore is electrically connected to the fifth region of the conductive layer 10b.

The conductive layer 10a and the conductive layer 10b are preferably fabricated in the same fabrication process, and the magnetoresistance device 20a and the magnetoresistance device 20b are preferably fabricated in the same fabrication process. The magnetoresistance devices fabricated in the same fabrication process have a less difference in the characteristics, and therefore have a large operation margin. The conductive layer 10a, the conductive layer 10b, and the conductive layer 10c are preferably fabricated integrally in the same process. In this case, the conductive layer 10a, the conductive layer 10b, and the conductive layer 10c are fabricated with the same material. The conductive layer 10c may be fabricated in a process that is different from the process for fabricating the conductive layer 10a and the conductive layer 10b.

Figure 2:
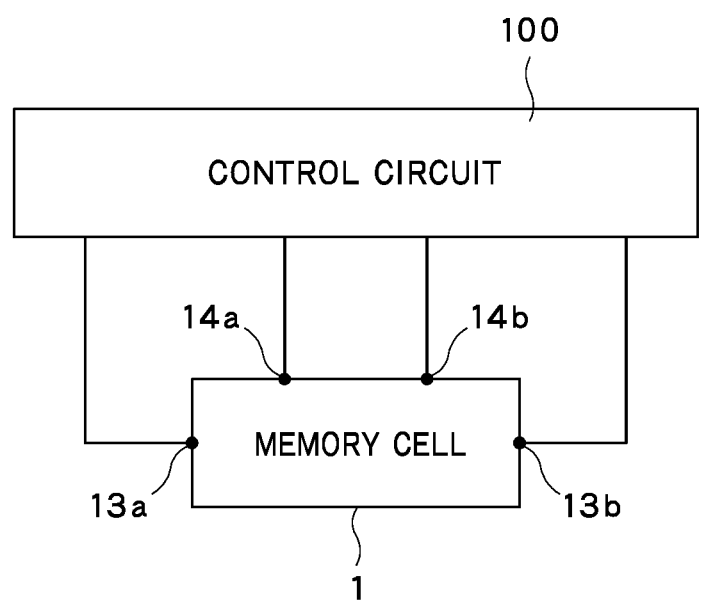
FIG. 2 is a block diagram of the magnetic memory according to the first embodiment.

As shown in FIG. 2, the terminals 13a, 13b, 14a, and 14b of the memory cell 1 are electrically connected to a control circuit 100. Voltage or current is supplied to the terminals 13a, 13b, 14a, and 14b by the control circuit 100.

Elements of the memory cell 1 will be described below.
(Conductive Layers)

The conductive layers 10a and 10b are fabricated with a nonmagnetic material having the spin Hall effect, such as Ta, W, Hf, Re, Cu—Bi, Ag—Bi, Pt—B, Cr—B, or V—B. A material containing Pt, Pd, Pd—B, Pd—Bi, Ag—B, Au, Au—W, Cu—B, Cu—Ir, Ru—B, Ru—Bi, Rh—B, Rh—Bi, Ir, or Ir—Bi may also be used. A material "A-B" means an alloy containing an element A and an element B. In the first embodiment, the conductive layers 10a and 10b are fabricated with Ta, for example. The conductive layer 10c may be fabricated with the same material as the material of the conductive layers 10a and 10b.

Figure 3:
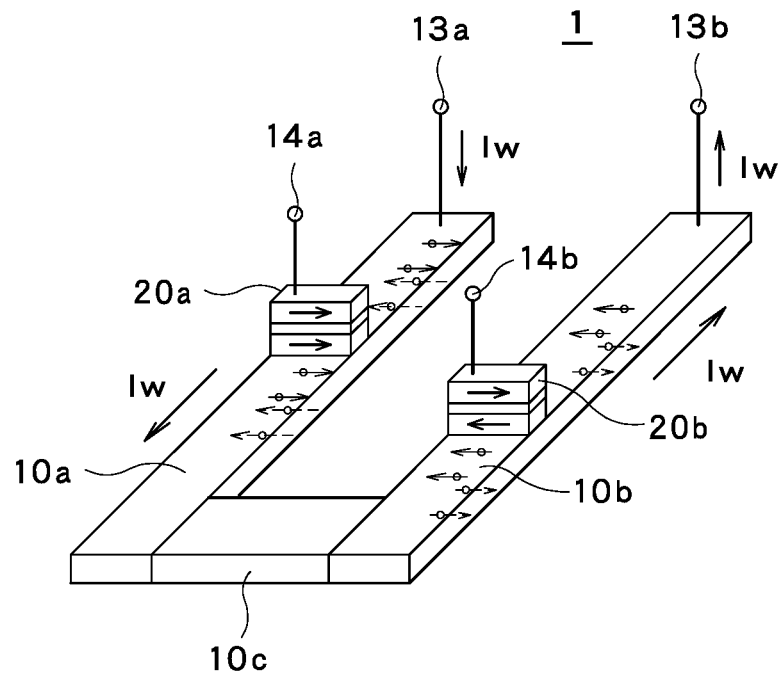
FIG. 3 is an explanatory diagram of a write operation for the magnetic memory according to the first embodiment.

If current Iw flows from the terminal 13a to the terminal 13b as shown in FIG. 3, electrons with right-pointing (from left to right) spin are accumulated on the upper side of the conductive layer 10a, and electrons with left-pointing (from right to left) spin are accumulated in the lower side of the conductive layer 10a, and electrons with left-pointing spin are accumulated in the upper side of the conductive layer 10b, and electrons with right-pointing spin are accumulated in the lower side of the conductive layer 10b.

Figure 4:
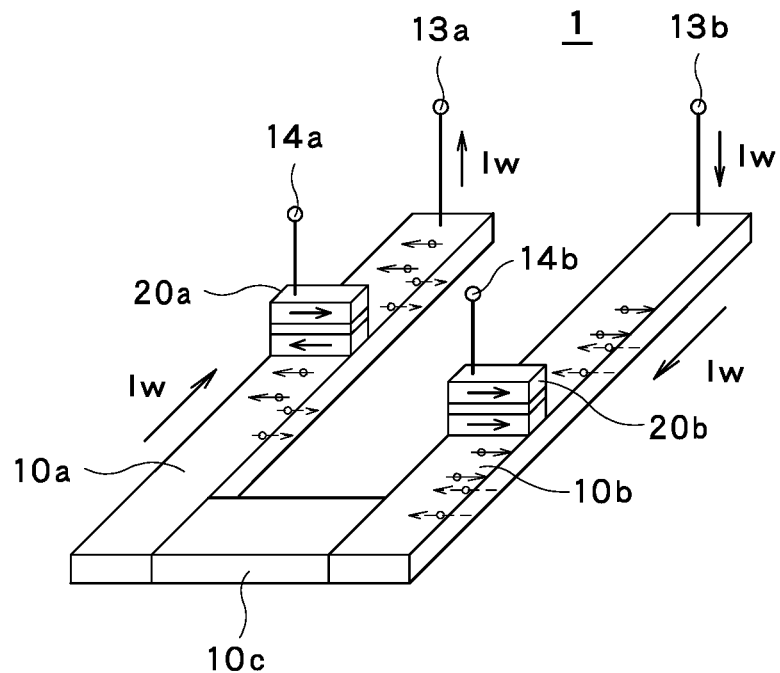
FIG. 4 is an explanatory diagram of the write operation for the magnetic memory according to the first embodiment.

Contrary to the case shown in FIG. 3, if the current Iw flows from the terminal 13b to the terminal 13a as shown in FIG. 4, electrons with left-pointing spin are accumulated in the upper side of the conductive layer 10a, and electrons with right-pointing spin are accumulated in the lower side of the conductive layer 10a, and electrons with right-pointing spin are accumulated in the upper side of the conductive layer 10b, and electrons with right-pointing spin are accumulated in the lower side of the conductive layer 10b. The directions of the spins of the accumulated electrons are dependent on the spin Hall angle of the materials of the conductive layers 10a and 10b, and may be opposite to those shown in FIGS. 3 and 4. The direction of the write current Iw flowing through the conductive layers 10a and 10b is controlled by the control circuit 100.

(Magnetoresistance Devices)

The directions of the magnetizations in the storage layers 21a and 21b and the reference layers 23a and 23b of the magnetoresistance devices 20a and 20b are parallel to the film plane. The "film plane" here means the top surface of each of the magnetoresistance devices 20a and 20b. The storage layers 21a and 21b and the reference layers 23a and 23b therefore are in-plane magnetization layers in which the magnetization direction is parallel to a surface that is intersecting with the layer-stacking direction.

The storage layers 21a and 21b are, for example, CoFeB layers, the nonmagnetic layers 22a and 22b are, for example, MgO layers, and the reference layers 23a and 23b have, for example, a multilayer structure such as CoFeB/Ru/CoFe/IrMn. The reference layers 23a and 23b have a synthetic antiferromagnetic multilayer structure in which antiferromagnetic coupling of the CoFeB layer and the CoFe layer occurs through the Ru. The magnetization directions of the CoFeB layer and the CoFe layer in each of the reference layers 23a and 23b are therefore antiparallel to each other.

The magnetoresistance device 20a and the magnetoresistance device 20b are patterned to have a planar shape of rectangle. The stable magnetization direction determined by the shape magnetic anisotropy in each of the storage layers 21a and 21b is along the long axis of the rectangle. In the first embodiment, the long axis extends in the direction that intersects, perpendicularly for example, the write current Iw flowing through the conductive layers 10a and 10b.

(Write Operation)

The magnetoresistance devices 20a and 20b in the memory cell 1 store data as the magnetization directions in the storage layers 21a and 21b. In the first embodiment, the magnetization directions of the storage layer 21a and the storage layer 21b in the magnetoresistance device 20a and the magnetoresistance device 20b are set to be opposite to each other in order to achieve a high sped read operation. The magnetization direction of the magnetic material of the storage layer 21a is opposite to the magnetization direction of the magnetic material of the storage layer 21b.

In a write operation, the control circuit 100 generates write current Iw to flow between the terminal 13a and the terminal 13b. The control circuit 100 thus includes a write circuit. In this embodiment, the write current does not pass through the nonmagnetic layers 22a and 22b of the magnetoresistance devices 20a and 20b, and therefore it is not necessary to greatly worry about the breakdown of the devices. Therefore, a large operation margin can be obtained in a write operation.

FIG. 3 shows a case where the write current Iw flows from the terminal 13a to the terminal 13b, and FIG. 4 shows a case where the write current Iw flows from the terminal 13b to the terminal 13a.

In this embodiment, the direction of the magnetization in the reference layer 23a (magnetic layer) on the nonmagnetic layer 22a side, and the direction of the magnetization in the reference layer 23b (magnetic layer) on the nonmagnetic layer 22b side are from left to right as shown in FIGS. 3 and 4.

When the write current Iw flows, spin is accumulated on the upper portions of the conductive layer 10a and the conductive layer 10b due to the spin Hall effect. The spin is introduced to the storage layer 21a and the storage layer 21b to switch the magnetization directions of the storage layer 21a and the storage layer 21b.

In FIG. 3, the current flows through the conductive layer 10a from the far side to the near side in the paper, and the current flows through the conductive layer 10b from the near side to the far side in the paper. Thus, the direction of the current flowing through the conductive layer 10a is opposite to the direction of the current flowing through the conductive layer 10b.

In FIG. 3, the direction of magnetization in the storage layer 21a of the magnetoresistance device 20a is from left to right, and the direction of magnetization in the storage layer 21b of the magnetoresistance device 20b is from right to left due to the spin accumulation caused by the spin Hall effect. When the write current flows as shown in FIG. 3, the magnetoresistance device 20a is brought into a low-resistance state, and the magnetoresistance device 20b is brought into a high-resistance state. Thus, the write current Iw flowing as shown in FIG. 3 causes the memory cell 1 to be in a "0" state.

In FIG. 4, the write current Iw flows through the conductive layer 10a from the near side to the far side in the paper, and flows through the conductive layer 10b from the far side to the near side in the paper. Thus, the direction of the current flowing through the conductive layer 10a is opposite to the direction of current flowing through the conductive layer 10b.

In FIG. 4, the direction of magnetization in the storage layer 21a of the magnetoresistance device 20a is from right to left, and the direction of magnetization in the storage layer 21b of the magnetoresistance device 20b is from left to right due to the spin accumulation caused by the spin Hall effect. When the write current Iw flows as shown in FIG. 4, the magnetoresistance device 20a is brought into a high-resistance state, and the magnetoresistance device 20b is brought into a low-resistance state. Thus, the write current Iw flowing as shown in FIG. 4 causes the memory cell 1 to be in a "1" state. The write operation in this embodiment thus is performed using the spin orbit torque (SOT). Like the STT method, the write method using the SOT does not require the generation of a magnetic field, and can reduce the power consumption.

As shown in FIGS. 3 and 4, the write current Iw causes the direction of magnetization in the storage layer 21a of the magnetoresistance device 20a and the direction of magnetization in the storage layer 21b of the magnetoresistance device 20b to be opposite to each other. Therefore, one of the magnetoresistance device 20a and the magnetoresistance device 20b is brought into the high-resistance state while the other is brought into the low-resistance state.

In this embodiment, every time the write current Iw flows, one of the magnetoresistance device 20a and the magnetoresistance device 20b is brought into the high-resistance state and the other is brought into the low-resistance state. In the write operation of this embodiment, the write current Iw flows as shown in FIG. 3 to bring the memory cell 1 into the "0" state or as shown in FIG. 4 to bring the memory cell 1 into the "1" state.

(Read Operation)

How data is read from the memory cell 1 will be described below.

Figure 5:
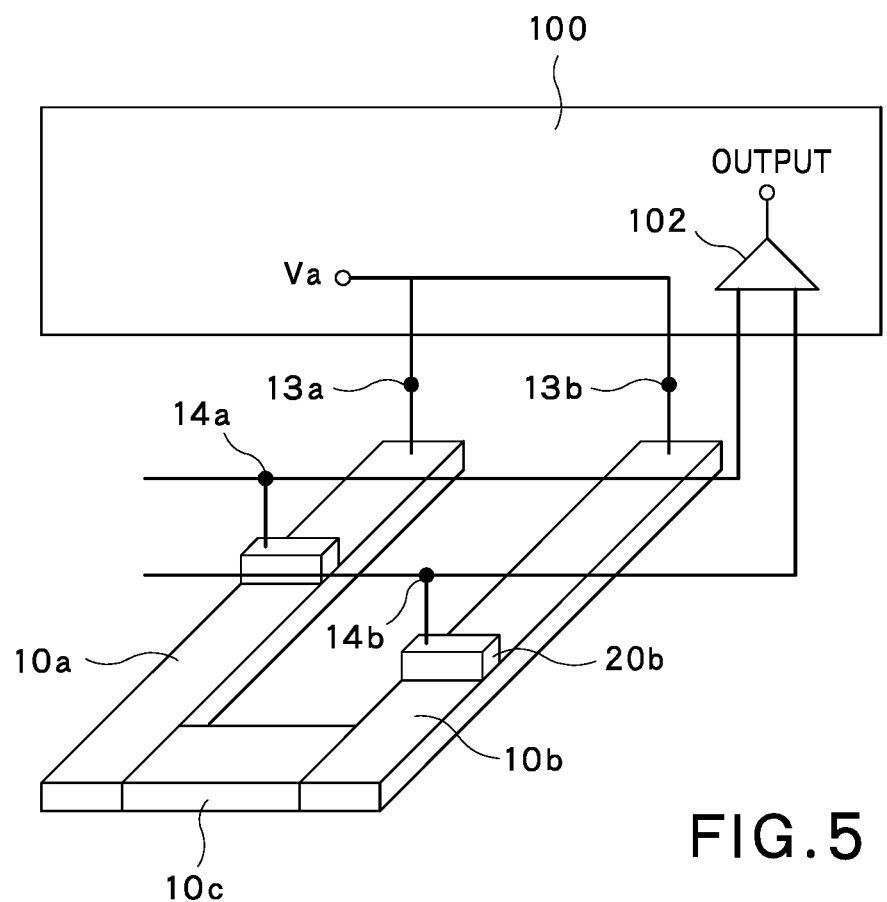
FIG. 5 is an explanatory diagram of a read operation for the magnetic memory according to the first embodiment.

As shown in FIG. 5, voltage Va is applied to both the terminal 13a and the terminal 13b, and current flows from each of the terminal 14a and the terminal 14b to the control circuit 100. A sense amplifier 102 included in the control circuit 100 reads voltage difference between the terminal 14a and the terminal 14b. The control circuit 100 thus includes a readout circuit.

Although the same voltage Va is applied to the terminal 13a and the terminal 13b in FIG. 5, different voltage may be applied to the terminal 13a and the terminal 13b. Although the voltage difference between the terminal 14a and the terminal 14b is read by means of the sense amplifier 102 in FIG. 5, a comparator (not shown) may be used instead of the sense amplifier. Although the same voltage Va is applied to the terminal 13a and the terminal 13b in this embodiment, voltage may be applied to one of the terminal 13a and the terminal 13b, and the other may be left to be in a floating state.

One of the magnetoresistance device 20a and the magnetoresistance device 20b is in the high-resistance state and the other is in the low-resistance state. In a memory cell including a single magnetoresistance device, an approximately mean resistance between the high resistance and the low resistance of the magnetoresistance device is compared with the actual resistance of the magnetoresistance device.

In this embodiment, the memory cell 1 includes the two magnetoresistance devices. By reading voltage difference between the voltage at the terminal 14a and the voltage at the terminal 14b, the read voltage becomes twice the voltage read in the memory cell including the single magnetoresistance device.

The path for the write current is different from the path for the read current in this embodiment. Therefore, large voltage may be applied in the read operation. As read voltage increases, a faster read operation may be performed.

Thus, the first embodiment, in which large voltage is used and voltage difference is read, may achieve a high-speed read operation.

The magnetic memory according to the first embodiment operates at a high speed in writing and reading data, and has large write and read margins.

The magnetic memory according to the first embodiment not only achieves a large operation margin but also low power consumption.

The magnetoresistance devices 20a and 20b according to the first embodiment may be magnetic tunnel junction (MTJ) devices in which the nonmagnetic layers 22a and 22b are insulating material layers, or giant magneto-resistance (GMR) devices in which the nonmagnetic layers 22a and 22b are metal layers.

The conductive layers 10a and 10b of the first embodiment may be formed of a material with large spin Hall effect, as shown in a single metal material such as Hf, Ta, W, Re, Os, Ir, Pt, Au, or Bi, a metal material containing Hf, Ta, W, Re, Os, Ir, Pt, Au, or Bi, or a material obtained by adding a material such as Hf, Ta, W, Re, Os, Ir, Pt, Au, or Bi to a conductive material.

The reference layers 23a and 23b of the first embodiment may have a multilayer structure including a magnetic layer and an antiferromagnetic layer. For example, the reference layers 23a and 23b may have a multilayer structure expressed as CoFe/IrMn.

Each of the reference layers 23a and 23b of the first embodiment has a synthetic multilayer structure but may be a single magnetic layer. A single CoFeB layer, for example, may be used as each of the reference layers 23a and 23b.

A CoFeB layer or a magnetic layer containing a magnetic material other than CoFe may be used as each of the storage layers 21a and 21b and the magnetic layers of the reference layers 23a and 23b.

A perpendicular magnetization material in which the direction of magnetization is perpendicular to the film plane of the magnetic layer may be used to form the storage layers 21a and 21b and the reference layers 23a and 23b of the first embodiment.

Each of the storage layers and the reference layers may be a layer of magnetic material including at least one of an elemental metal such as Ni, Fe, or Co, an alloy such as Ni—Fe alloy, Co—Fe alloy, Co—Ni alloy, or Co—Fe—Ni alloy, an amorphous material such as (Co, Fe, Ni)-(Si, B), (Co, Fe, Ni)-(Si, B)-(P, Al, Mo, Nb, Mn), or Co-(Zr, Hf, Nb, Ta, Ti), or a Heusler alloy, or may have a multilayer structure including layers of the aforementioned materials. The expression (Co, Fe, Ni), for example, means that at least one of Co, Fe, and Ni is included. A Heusler alloy has a composition expressed as $X_2YZ$ where X is Co, Y is at least one element selected from V, Cr, Mn, and Fe, and Z is at least one element selected from Al, Si, Ga, and Ge.

The magnetic material included in the storage layers and the reference layers may be a perpendicular magnetization material such as an alloy containing any of FePt, CoPt, CoCrPt, or (Co, Fe, Ni)-(Pt, Ir, Pd, Rh)-(Cr, Hf, Zr, Ti, Al, Ta, Nb), or (Co, Fe)/(Pt, Ir, Pd). The storage layers and the reference layers may include a multilayer structure obtained by stacking layers of the aforementioned perpendicular magnetization materials.

The magnetic characteristics of the aforementioned magnetic materials may be adjusted by adding thereto a nonmagnetic element such as silver (Ag), copper (Cu), gold (Au), aluminum (Al), ruthenium (Ru), osmium (Os), rhenium (Re), tantalum (Ta), boron (B), carbon (C), oxygen (O), nitrogen (N), palladium (Pd), platinum (Pt), zirconium (Zr), iridium (Ir), tungsten (W), molybdenum (Mo), or niobium (Nb). Other physical characteristics such as the crystallinity, the mechanical characteristics, and the chemical characteristics may also be adjusted by the addition of the nonmagnetic element.

The nonmagnetic layers 22a and 22b may include an insulating material such as aluminum oxide ($Al_2O_3$), silicon oxide ($SiO_2$), magnesium oxide (MgO), aluminum nitride (AlN), silicon nitride (SiN), bismuth oxide ($Bi_2O_3$), magnesium fluoride ($MgF_2$), calcium fluoride ($CaF_2$), strontium titanate ($SrTiO_3$), lanthanum aluminate ($LaAlO_3$), aluminum oxinitride (Al—N—O), or HfO(hafnium oxide), or a composite material obtained by combining two or more of the aforementioned insulating materials.

The nonmagnetic layers 22a and 22b may also include at least one nonmagnetic metal selected from copper, silver, gold, vanadium, chromium, and ruthenium. The nonmagnetic metal may include an insulating material for current constriction.

Examples of the antiferromagnetic material are iron-manganese (Fe—Mn), platinum-manganese (Pt—Mn), platinum-chromium-manganese (Pt—Cr—Mn), nickel-manganese (Ni—Mn), iridium-manganese (Ir—Mn), palladium-platinum-manganese (Pd—Pt—Mn), nickel oxide (NiO), and iron oxide ($Fe_2O_3$).

The antiferromagnetic material may have a magnetically coupled multilayer structure expressed as magnetic material/nonmagnetic material/antiferromagnetic material, or a multilayer structure expressed as (magnetic material/nonmagnetic material)n/antiferromagnetic material (n≥2). The expression (magnetic material/nonmagnetic material)n means that, in the multilayer structure, a magnetic material and a nonmagnetic material is stacked n times.

In the first embodiment, the magnetoresistance device 20a and the terminal 13a are disposed on or above the conductive layer 10a, and the magnetoresistance device 20b and the terminal 13b are disposed on or above the conductive layer 10b. However, the magnetoresistance device 20a and the terminal 13a may be disposed under or below the conductive layer 10a, and the magnetoresistance device 20b and the terminal 13b may be disposed under or below the conductive layer 10b. The terminal 13a may be disposed on or above the conductive layer 10a while the terminal 13b is disposed under or below the conductive layer 10b, and the terminal 13a may be disposed under or below the conductive layer 10a while the terminal 13b is disposed on or above the conductive layer 10b.

In the first embodiment, the magnetoresistance device 20a and the magnetoresistance device 20b may be patterned to have a planar shape of parallelogram or ellipse, and the direction of magnetization in the devices may be set to be along the long axis of the shape by shape anisotropy.

In the first embodiment, the direction of magnetization of the magnetic layer serving as the reference layer 23a that is in contact with the nonmagnetic layer 22a and the direction of magnetization of the magnetic layer serving as the reference layer 23b that is in contact with the nonmagnetic layer 22b are from left to right, as shown in FIGS. 3 and 4. Unlike the case shown in FIGS. 3 and 4, however, the direction magnetization may be from right to left.

In the first embodiment, the state of the memory cell 1 when the write current flows in a manner shown in FIG. 3 may be set as the "1" state, and the state of the memory cell 1 when the write current flows in a manner shown in FIG. 4 may be set as the "0" state.

First Modification

Figure 6:
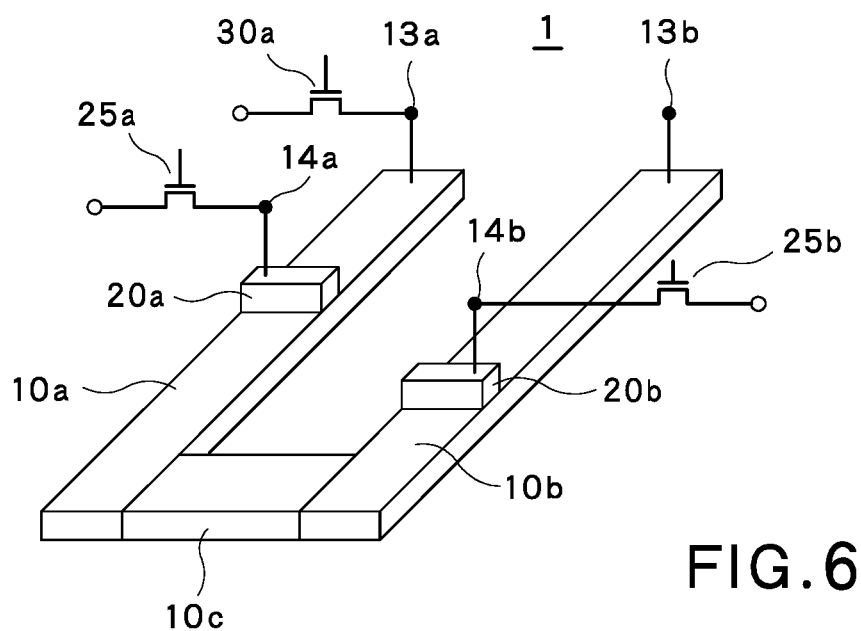
FIG. 6 is a perspective view of a memory cell included in a magnetic memory according to a first modification of the first embodiment.

A magnetic memory according to a first modification of the first embodiment will be described with reference to FIG. 6. The magnetic memory according to the first modification includes at least one memory cell, which is shown in FIG. 6. The memory cell 1 according to the first modification is obtained by adding, to the memory cell 1 according to the first embodiment shown in FIG. 1, a MOS transistor 30a of which one of the source and the drain is electrically connected to the terminal 13a, a MOS transistor 25a of which one of the source and the drain is electrically connected to the terminal 14a, and a MOS transistor 25b of which one of the source and the drain is electrically connected to the terminal 14b.

The magnetic memory according to the first modification has a large operation margin and may achieve low power consumption, like the magnetic memory according to the first embodiment.

Second Modification

Figure 7:
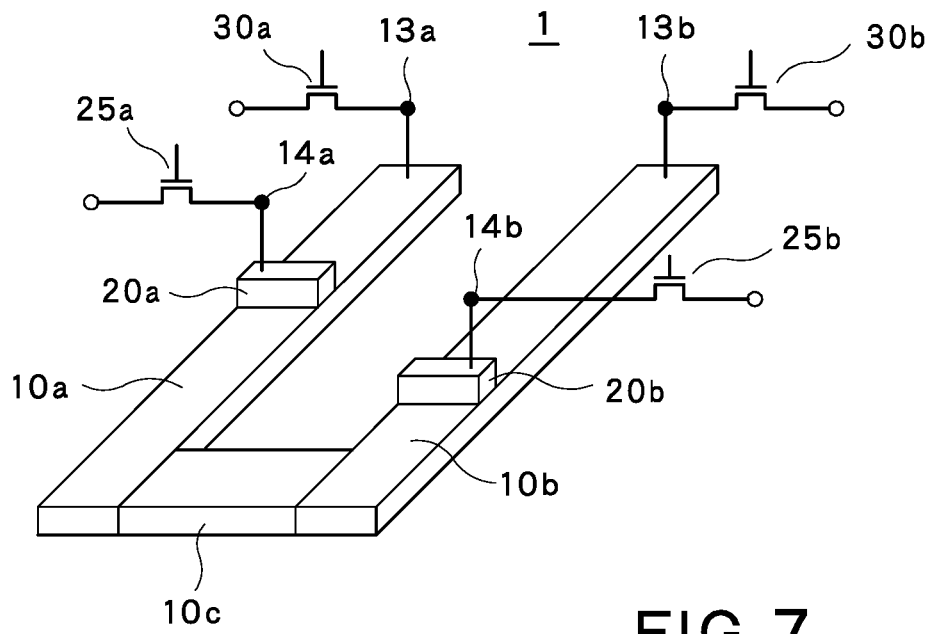
FIG. 7 is a perspective view of a memory cell included in a magnetic memory according to a second modification of the first embodiment.

A magnetic memory according to a second modification of the first embodiment will be described with reference to FIG. 7. The magnetic memory according to the second modification includes at least one memory cell, which is shown in FIG. 7. The memory cell 1 according to the second modification is obtained by adding, to the memory cell 1 of the first modification shown in FIG. 6, a MOS transistor 30b of which one of the source and the drain is connected to the terminal 13b.

The magnetic memory according to the second modification has a large operation margin and may achieve low power consumption, like the magnetic memory according to the first modification.

Third Modification

Figure 8:
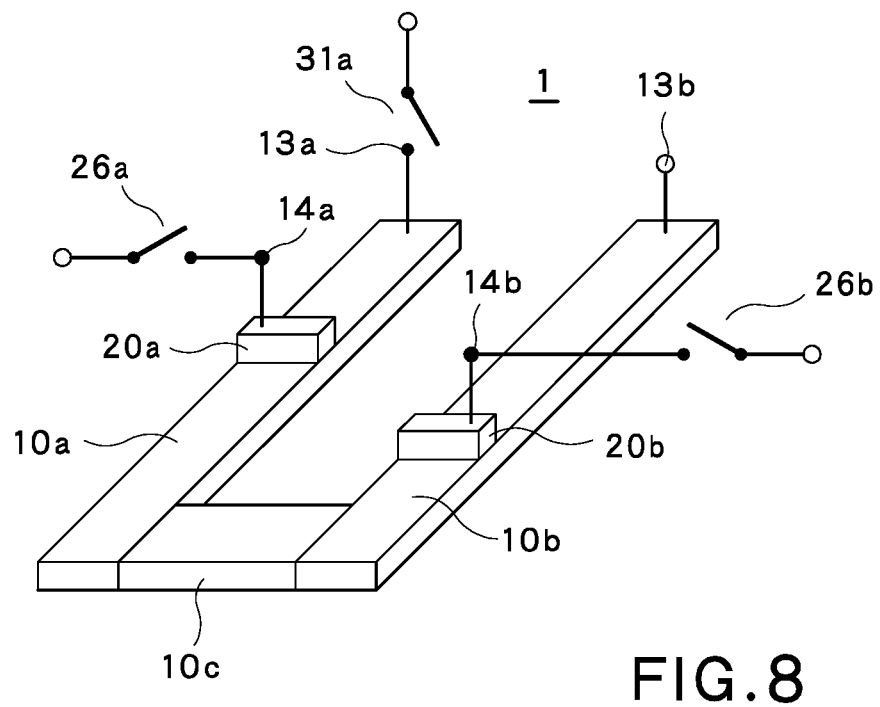
FIG. 8 is a perspective view of a memory cell included in a magnetic memory according to a third modification of the first embodiment.

A magnetic memory according to a third modification of the first embodiment will be described with reference to FIG. 8. The magnetic memory according to the third modification includes at least one memory cell, which is shown in FIG. 8. The memory cell 1 according to the third modification is obtained by adding, to the memory cell 1 according to the first embodiment shown in FIG. 1, a switch 31a, one terminal of which is electrically connected to the terminal 13a, a switch 26a, one terminal of which is electrically connected to the terminal 14a, and a switch 26b, one terminal of which is electrically connected to the terminal 14b.

The magnetic memory according to the third modification has a large operation margin and may achieve low power consumption, like the magnetic memory according to the first embodiment.

Fourth Modification

Figure 9:
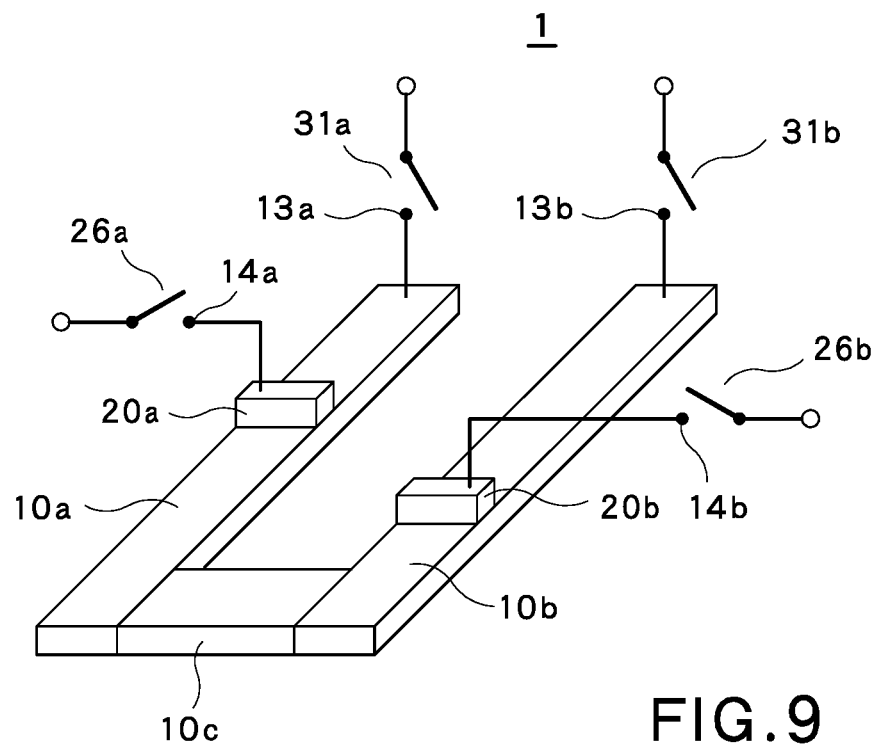
FIG. 9 is a perspective view of a memory cell included in a magnetic memory according to a fourth modification of the first embodiment.

A magnetic memory according to a fourth modification of the first embodiment will be described with reference to FIG. 9. The magnetic memory according to the fourth modification includes at least one memory cell, which is shown in FIG. 9. The memory cell 1 according to the first modification is obtained by adding, to the memory cell 1 according to the third modification shown in FIG. 8, a switch 31b, one terminal of which is electrically connected to the terminal 13b.

The magnetic memory according to the fourth modification has a large operation margin and may achieve low power consumption, like the magnetic memory according to the third modification.

In the first embodiment and its modifications, current flows between the terminal 13a and the terminal 13b in write operations. Instead of this, voltage may be applied between the terminal 13a and the terminal 13b.

In the first embodiment and its modifications, voltage is applied between the terminal 13a and the terminal 13b in a read operation. Instead of this, current may flow between the terminal 13a and the terminal 13b.

In the read operation of the first embodiment, voltage is applied to the terminal 13a and the terminal 13b and voltage difference between the terminal 14a and the terminal 14b is read. Instead of this, current may flow between the terminal 14a and the terminal 14b and voltage at the terminal 13a or the terminal 13b may be read.

In the read operation of the first embodiment, voltage is applied to the terminal 13a and the terminal 13b and voltage difference between the terminal 14a and the terminal 14b is read. Instead of this, voltage may be applied to the terminal 14a and the terminal 14b, and voltage at the terminal 13a or the terminal 13b may be read.

Second Embodiment

A magnetic memory according to a second embodiment will be described below. The magnetic memory according to the second embodiment has the same configuration as the magnetic memory according to the first embodiment shown in FIG. 1, but is different in the write method by means of the control circuit 100.

A write operation to write data to the memory cell 1 according to the second embodiment is performed by applying voltage to each of the magnetoresistance device 20a and the magnetoresistance device 20b through the terminal 14a and the terminal 14b of the memory cell 1 according to the first embodiment shown in FIG. 3 or FIG. 4 to control the perpendicular magnetic anisotropy between the storage layer 21a and the nonmagnetic layer 22a and between the storage layer 21b and the nonmagnetic layer 22b. Such a write method is called voltage-control magnetic anisotropy (VCMA). The write current may be reduced by using the VCMA.

In the write operation according to the second embodiment, control voltage Vw is applied to the terminal 14a and the terminal 14b by means of the control circuit 100 before the write current Iw flows. When data is written to the magnetoresistance device 20a and the magnetoresistance device 20b, the control voltage Vw is negative voltage relative to the voltage at the terminal 13a or the terminal 13b, for example −0.6 V. The VCMA adds perpendicular magnetic anisotropy to the storage layer 21a and the storage layer 21b to facilitate the switching of magnetization.

Figure 10:
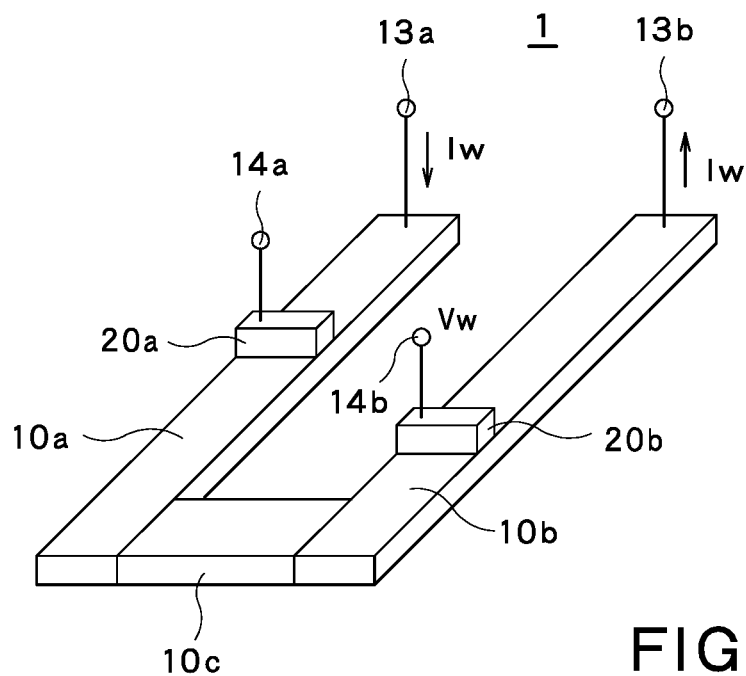
FIG. 10 is an explanatory diagram of a write operation for a magnetic memory according to a second embodiment.

After the control voltage Vw is applied to the terminal 14a and the terminal 14b, the write current Iw flows between the terminal 13a and the terminal 13b as shown in FIG. 10. Due to the write current Iw, spin is accumulated in the upper part of each of the conductive layers 10a and 10b. The spin is then introduced to the storage layer 21a and the storage layer 21b to switch the magnetization of the storage layer 21a and the storage layer 21b.

Figure 11:
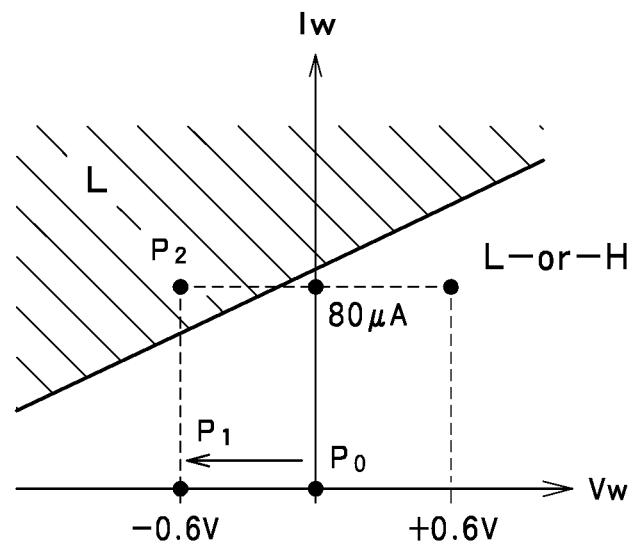
FIG. 11 is an explanatory diagram of a write operation for the second embodiment.

FIG. 11 shows the state of the magnetoresistance device 20a in the write operation. In FIG. 11, the vertical axis represents the write current Iw, the horizontal axis represents the control voltage Vw, the hatched region represents the low-resistance state "L," of the magnetoresistance device 20a, and the other region represents the "L-or-H" state of the magnetoresistance device 20a, which means that the magnetoresistance device 20a may be either in the low resistance state or the high resistance state.

The initial state of the magnetoresistance device 20a is the state $P_0$ in which neither write current nor control voltage is supplied by the control circuit 100 shown in FIG. 2.

The state then moves to $P_1$ when the control circuit 100 applies the control voltage Vw of −0.6 V to the terminal 14a. The state then moves to $P_2$ when the control circuit 100 generates write current Iw of 80 μA to flow from the terminal 13a to the terminal 13b. The state $P_2$ is the low-resistance state "L" and the magnetoresistance device 20a is brought into the low-resistance state.

Finally, the state moves to $P_0$ in which the control circuit 100 does not supply the write current and the control voltage.

Figure 12:
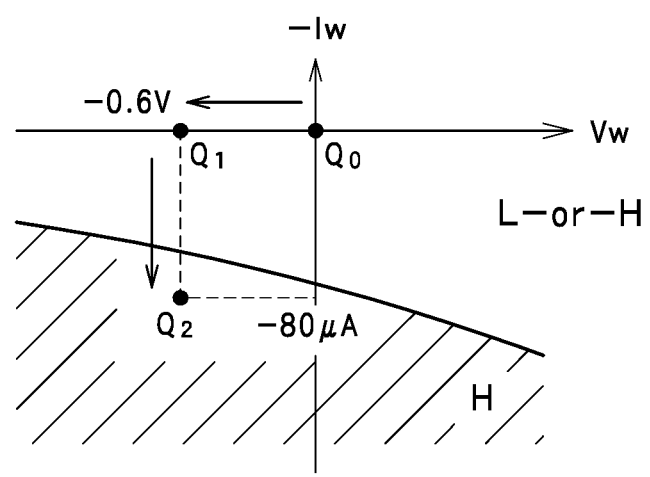
FIG. 12 is an explanatory diagram of the write operation for the second embodiment.

FIG. 12 shows the state of the magnetoresistance device 20b. In FIG. 12, the vertical axis represents the write current −Iw with the inverted code, the horizontal axis represents the control voltage Vw, the hatched region represents the high-resistance state "H" of the magnetoresistance device 20b, and the other region represents the "L-or-H" state of the magnetoresistance device 20b, which means that the magnetoresistance device 20b may be either in the low resistance state or the high resistance state.

The initial state of the magnetoresistance device 20b is the state $Q_0$, in which neither write current nor write voltage is supplied by the control circuit 100.

The state then moves to $Q_1$ when the control circuit 100 applies the control voltage Vw of −0.6 V to the terminal 14b. The state then moves to $Q_2$ when the control circuit 100 generates the write current Iw of −80 μA between the terminal 13a and the terminal 13b. The state $Q_2$ is the high-resistance state "H" and the magnetoresistance device 20b is in the high-resistance state.

Finally, the state moves to $Q_0$, in which the control circuit 100 does not supply the write current and the control voltage.

Through the above writing process, the magnetoresistance device 20a is brought into the low-resistance state, and the magnetoresistance device 20b is brought into the high-resistance state. The memory cell 1 thus is brought into the "0" state.

If the control voltage Vw of −0.6 V is applied to the terminals 14a and 14b, and the write current Iw of 80 μA flows from the terminal 13b to the terminal 13a, the magnetoresistance device 20a is brought into the high-resistance state, and the magnetoresistance device 20b is brought into the low-resistance state. The memory cell 1 thus is brought into the "1" state.

In the second embodiment, a write operation may be performed with small write current due to the spin Hall effect and the VCMA.

According to the second embodiment, a nonvolatile memory that performs a write operation and a read operation at a high speed with large write and read operation margins may be obtained.

The magnetic memory according to the second embodiment has a large operation margin and may achieve low power consumption.

In the second embodiment, the control voltage Vw may be arbitrarily selected negative voltage that enables the storage layers 21a and 21b to switch the magnetization easily.

In the second embodiment, the write current Iw may have an arbitrarily selected current value that enables the storage layers 21a and 21b to switch the magnetization easily.

Although negative voltage is applied as the control voltage Vw in the second embodiment, positive voltage may be applied as the control voltage Vw if a magnetic material that may reduce the value of the write current when positive voltage is applied as the control voltage Vw is included in the storage layers 21a and 21b.

The second embodiment may be applied to the magnetic memories of the first embodiment shown in FIGS. 6 to 9.

Third Embodiment

Figure 13:
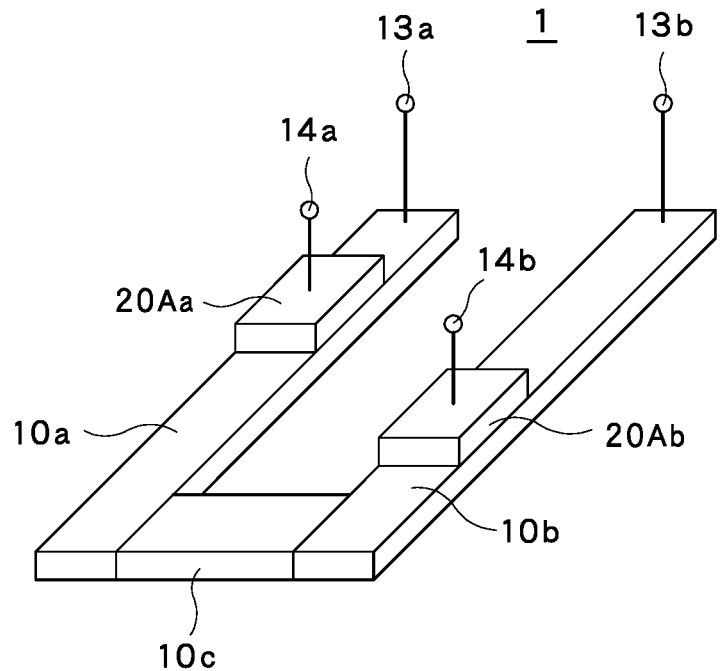
FIG. 13 is a perspective view of a memory cell included in a magnetic memory according to a third embodiment.

A magnetic memory according to a third embodiment will be described with reference to FIGS. 13 to 14B. The magnetic memory according to the third embodiment includes at least one memory cell, which is shown in FIG. 13. The memory cell 1 according to the third embodiment has a configuration obtained by replacing the magnetoresistance devices 20a and 20b of the memory cell 1 according to the first embodiment or the second embodiment shown in FIG. 1 with magnetoresistance devices 20Aa and 20Ab.

Figure 14A:
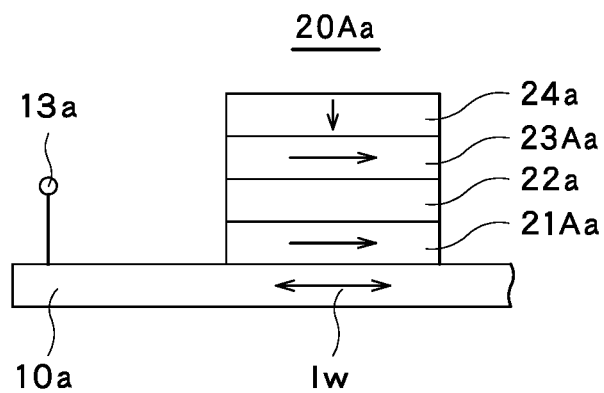
FIGS. 14A and 14B are cross-sectional views illustrating the configuration of a magnetoresistance device of the third embodiment.
Figure 14B:
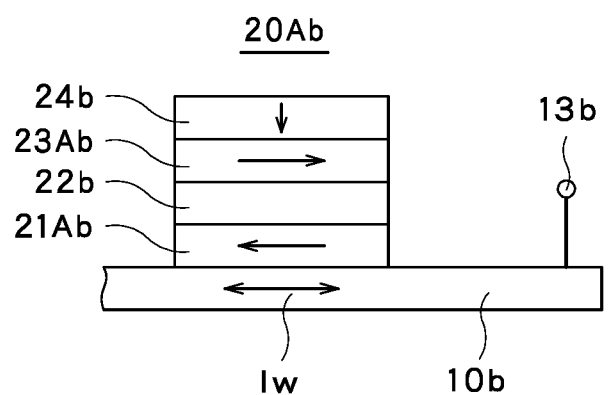

FIG. 14A illustrates the magnetoresistance device 20Aa and FIG. 14B illustrates the magnetoresistance device 20Ab. The magnetoresistance device 20Aa has a multilayer structure including a storage layer 21Aa disposed on the conductive layer 10a, a nonmagnetic layer 22a disposed on the storage layer 21Aa, a reference layer 23Aa disposed on the nonmagnetic layer 22a, and a perpendicular magnetization material layer 24a disposed on the reference layer 23Aa. As in the first embodiment, the storage layer 21Aa is electrically connected to the conductive layer 10a. The magnetization direction in each of the storage layer 21Aa and the reference layer 23Aa is parallel to the direction of write current Iw flowing through the conductive layer 10a. The magnetization direction of the perpendicular magnetization material layer 24a is parallel to the stacking direction of the magnetoresistance device 20Aa.

The magnetoresistance device 20Ab has a multilayer structure including a storage layer 21Ab disposed on the conductive layer 10b, a nonmagnetic layer 22b disposed on the storage layer 21Ab, a reference layer 23Ab disposed on the nonmagnetic layer 22b, and a perpendicular magnetization material layer 24b disposed on the reference layer 23Ab. As in the first embodiment, the storage layer 21Ab is electrically connected to the conductive layer 10b. The magnetization direction of each of the storage layer 21Ab and the reference layer 23Ab is parallel to the direction of the write current Iw flowing through the conductive layer 10b. The magnetization direction of the perpendicular magnetization material layer 24b is parallel to the stacking direction of the magnetoresistance device 20Ab. The magnetization direction in the reference layer 23Aa and the magnetization direction in the reference layer 23Ab are the same, for example from left to right in FIGS. 14A and 14B.

In the magnetoresistance device 20Aa according to this embodiment, a biased magnetic field that is perpendicular to the film plane is applied to the storage layer 21Aa from a magnetic field that flows from the perpendicular magnetization material layer 24a in the stacking direction of the magnetoresistance device 20Aa. The direction of magnetization in the storage layer 20Aa is parallel to the write current Iw flowing through the conductive layer 10a, and the biased magnetic field that is perpendicular to the film plane is applied to the storage layer 20Aa. Therefore, in a write operation, the direction of magnetization in the storage layer 20Aa is switched in a direct mode. In order to apply the biased magnetic field that is perpendicular to the film plane to the storage layer 21Aa, the perpendicular magnetization material layer 24a may be disposed to be separate from the reference layer 23Aa or below the storage layer 21Aa.

A biased magnetic field that is perpendicular to the film plane is applied to the storage layer 21Ab from a magnetic field that flows from the perpendicular magnetization material layer 24b in the stacking direction of the magnetoresistance device 20Ab, as shown in FIG. 14B. The direction of magnetization in the storage layer 21Ab is parallel to the write current Iw flowing through the conductive layer 10b, and the biased magnetic field that is perpendicular to the film plane is applied to the storage layer 21Ab. Therefore, in a write operation, the direction of magnetization in the storage layer 21Ab is switched in a direct mode. In order to apply the biased magnetic field that is perpendicular to the film plane to the storage layer 21Ab, the perpendicular magnetization material layer 24b may be placed to be separate from the reference layer 23Ab or below the storage layer 21Ab.

In this embodiment, a permanent magnet that is largeer than the magnetoresistance devices 20Aa and 20Ab may be disposed to apply a biased magnetic field that is perpendicular to the film plane in a broad region including the storage layer 21Aa and the storage layer 21Ab, instead of disposing the perpendicular magnetization material layers 24a and 24b.

According to the third embodiment, a write operation may be performed with small write current due to the spin Hall effect, like the first embodiment.

Furthermore, in the third embodiment, a write operation may be performed with small write current due to the spin Hall effect and the VCMA, like the second embodiment.

According to the third embodiment, a magnetic memory that performs a write operation and a read operation at a high speed with large write and read operation margins may be obtained.

The magnetic memory according to the third embodiment has a large operation margin and may achieve low power consumption.

The third embodiment may be applied to the magnetic memories according to the modifications of the first embodiment shown in FIGS. 6 to 9.

Fourth Embodiment

Figure 15:
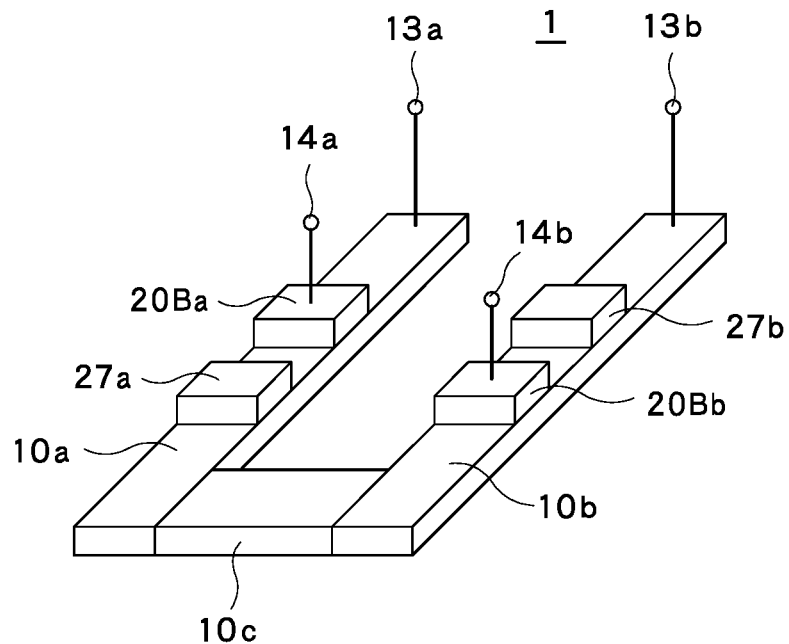
FIG. 15 is a perspective view of a memory cell included in a magnetic memory according to a fourth embodiment.

A magnetic memory according to a fourth embodiment will be described with reference to FIGS. 15 to 16B. The magnetic memory according to the fourth embodiment includes at least one memory cell, which is shown in FIG. 15. The memory cell 1 according to the fourth embodiment has a configuration obtained by replacing the magnetoresistance devices 20a and 20b of the memory cell 1 according to the first embodiment or the second embodiment shown in FIG. 1 with magnetoresistance devices 20Ba and 20Bb, and newly adding magnetic layers 27a and 27b.

Figure 16A:
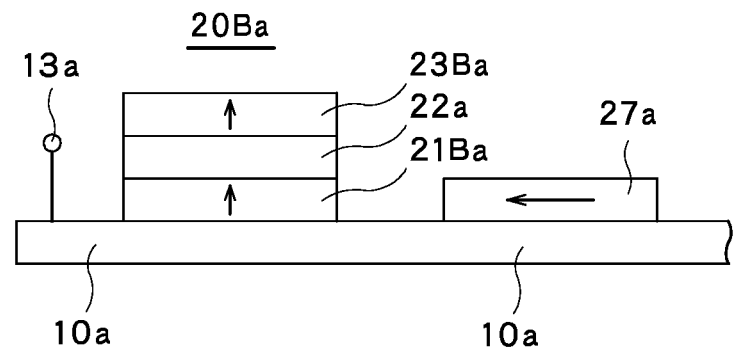
FIGS. 16A and 16B are cross-sectional views illustrating the magnetoresistance device according to the fourth embodiment.

As shown in FIG. 16A, the magnetoresistance device 20Ba includes a storage layer 21Ba disposed on the conductive layer 10a, a nonmagnetic layer 22a disposed on the storage layer 21Ba, and a reference layer 23Ba disposed on the nonmagnetic layer 22a. As in the case of the first embodiment, the storage layer 21Ba is electrically connected to the conductive layer 10a. Each of the storage layer 21Ba and the reference layer 23Ba has magnetization that is perpendicular to the film plane. The magnetic layer 27a is disposed on the conductive layer 10a so as to be separate from the magnetoresistance device 20Ba, and has magnetization that is parallel to the film plane. A biased magnetic field that is parallel to the film plane is applied from the magnetic layer 27a to the storage layer 21Ba. The storage layer 21Ba has magnetization that is perpendicular to the film plane, and the biased magnetic field that is parallel to the film plane is applied to the storage layer 21Ba. Therefore, in a write operation, the direction of magnetization in the storage layer 21Ba is switched in a direct mode. In order to apply the biased magnetic field that is parallel to the film plane to the storage layer 21Ba, the magnetic layer 27a is disposed to be substantially on the same plane as the storage layer 21Ba, and may be disposed on a conductive layer of an adjacent memory cell.

Figure 16B:
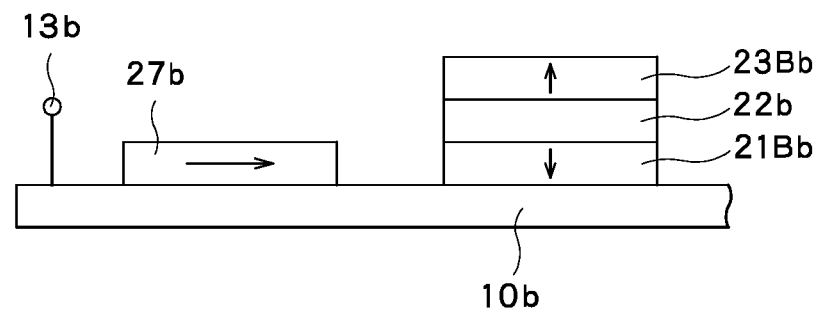

As shown in FIG. 16B, the magnetoresistance device 20Bb includes a storage layer 21Bb disposed on the conductive layer 10b, a nonmagnetic layer 22b disposed on the storage layer 21Bb, and a reference layer 23Bb disposed on the nonmagnetic layer 22b. As in the case of the first embodiment, the storage layer 21Bb is electrically connected to the conductive layer 10b. Each of the storage layer 21Bb and the reference layer 23Bb has magnetization that is perpendicular to the film plane. The magnetic layer 27b is disposed on the conductive layer 10b so as to be separate from the magnetoresistance device 20Bb, and has magnetization that is parallel to the film plane. A biased magnetic field that is parallel to the film plane is applied from the magnetic layer 27b to the storage layer 21Bb. The storage layer 21Bb has magnetization that is perpendicular to the film plane, and the biased magnetic field that is parallel to the film plane is applied to the storage layer 21Bb. Therefore, in a write operation, the direction of magnetization of the storage layer 21Bb is switched in a direct mode. In order to apply the biased magnetic field that is parallel to the film plane to the storage layer 21Bb, the magnetic layer 27b is disposed to be substantially on the same plane as the storage layer 21Bb, and may be disposed on a conductive layer of an adjacent memory cell.

The reference layer 23Ba and the reference layer 23Bb have the magnetization in the same direction. As shown in FIGS. 16A and 16B, for example, the magnetization of the reference layer 23Ba and the reference layer 23Bb is directed upward.

In this embodiment, a permanent magnet that is greater than the magnetoresistance devices 20Ba and 20Bb may be disposed to apply a biased magnetic field that is parallel to the film plane to the storage layer 21Ba and the storage layer 21Bb, instead of the magnetic layers 27a and 27b.

According to the fourth embodiment, a write operation may be performed with small write current due to the spin Hall effect, like the first embodiment.

Furthermore, according to the fourth embodiment, a write operation may be performed with small write current due to the spin Hall effect and the VCMA, like the second embodiment.

According to the fourth embodiment, a magnetic memory that performs a write operation and a read operation at a high speed with large write and read operation margins may be obtained.

The magnetic memory according to the fourth embodiment has a large operation margin and may achieve low power consumption.

The fourth embodiment may be applied to the magnetic memories according to the modifications of the first embodiment shown in FIGS. 6 to 9.

Fifth Embodiment

Figure 17:
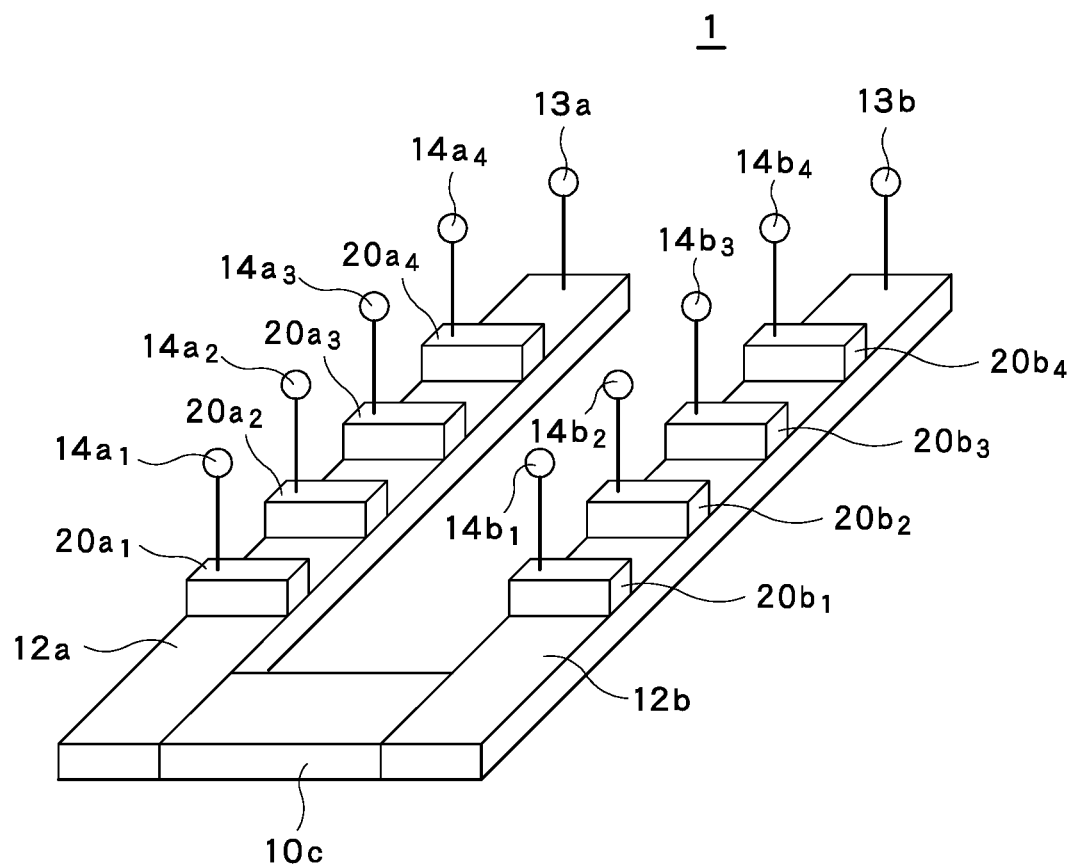
FIG. 17 is a perspective view of a memory cell included in a magnetic memory according to a fifth embodiment.

A magnetic memory according to a fifth embodiment will be described with reference to FIG. 17. The magnetic memory according to the fifth embodiment includes at least one memory cell, which is shown in FIG. 17. The memory cell 1 according to the fifth embodiment has a configuration obtained by disposing a plurality of magnetoresistance devices $20a_1$ to $20a_4$ instead of the magnetoresistance device 20a on the conductive layer 10a, and disposing a plurality of magnetoresistance devices $20b_1$ to $20b_4$ instead of the magnetoresistance device 20b on the conductive layer 10b in the memory cell 1 according to the first embodiment or the second embodiment shown in FIG. 1.

Each of the magnetoresistance devices $20a_1$ to $20a_4$ has the same configuration as the magnetoresistance device 20a according to the first embodiment, and each of the magnetoresistance devices $20b_1$ to $20b_4$ has the same configuration as the magnetoresistance device 20b according to the first embodiment. The reference layer of the magnetoresistance device $20a_i$ (i=1, . . . , 4) is electrically connected to the terminal $14a_i$. The reference layer of the magnetoresistance device $20b_i$ (i=1, . . . , 4) is electrically connected to the terminal $14b_i$.

If a write operation is performed on one of the magnetoresistance devices, for example the magnetoresistance device $20a_1$, according to the fifth embodiment, negative voltage is applied to the terminal $14a_1$ that is connected to the reference layer of the magnetoresistance device $20a_1$, positive voltage is applied to the terminals $14a_2$ to $14a_4$ and $14b_1$ to $14b_4$ that are electrically connected to the reference layers of the other magnetoresistance devices, for example the magnetoresistance device $20a_2$ to $20a_4$ and $20b_1$ to $20b_4$, and write current flows between the terminal 13a and the terminal 13b.

In this embodiment, one of the magnetoresistance devices $20a_1$ to $20a_4$ disposed on the conductive layer 10a and one of the magnetoresistance devices $20b_1$ to $20b_4$ disposed on the conductive layer 10b make a pair, and the write operation is performed to bring one of the two magnetoresistance devices in the pair into the high-resistance state, and the other into the low-resistance state.

In a read operation, current flows from at least one of the terminal 13a and the terminal 13b, and a resistance difference between a pair of magnetoresistance devices is read as voltage difference between the terminals that are electrically connected to the reference layers of magnetoresistance devices in the pair. For example, if the magnetoresistance device $20a_1$ and the magnetoresistance device $20b_2$ are paired, voltage difference between the terminal $14a_1$ and the terminal $14b_2$ is read with differential amplification. In a similar manner, a resistance difference between magnetoresistance devices included in each of the remaining pairs is read. The voltage difference between terminals that are electrically connected to reference layers of paired magnetoresistance devices may be read with differential amplification by applying voltage to at least one of the terminal 13a and the terminal 13b.

As described above, the magnetoresistance devices may be densely integrated with the configuration according to the fifth embodiment.

Although four magnetoresistance devices are disposed on each of the conductive layer 10a and the conductive layer 10b in this embodiment, the number of magnetoresistance devices disposed on each of the conductive layer 10a and the conductive layer 10b may be two or more.

According to the fifth embodiment, a write operation may be performed with small write current due to the spin Hall effect, like the first embodiment.

Furthermore, according to the fifth embodiment, a write operation may be performed with small write current due to the spin Hall effect and the VCMA, line the second embodiment.

According to the fifth embodiment, a magnetic memory that performed a write operation and a read operation at a high speed with large write and read operation margins may be obtained.

The magnetic memory according to the fifth embodiment has a large operation margin and may achieve low power consumption.

The fifth embodiment may be applied to the magnetic memories according to the modifications of the first embodiment shown in FIGS. 6 to 9.

Sixth Embodiment

Figure 18:
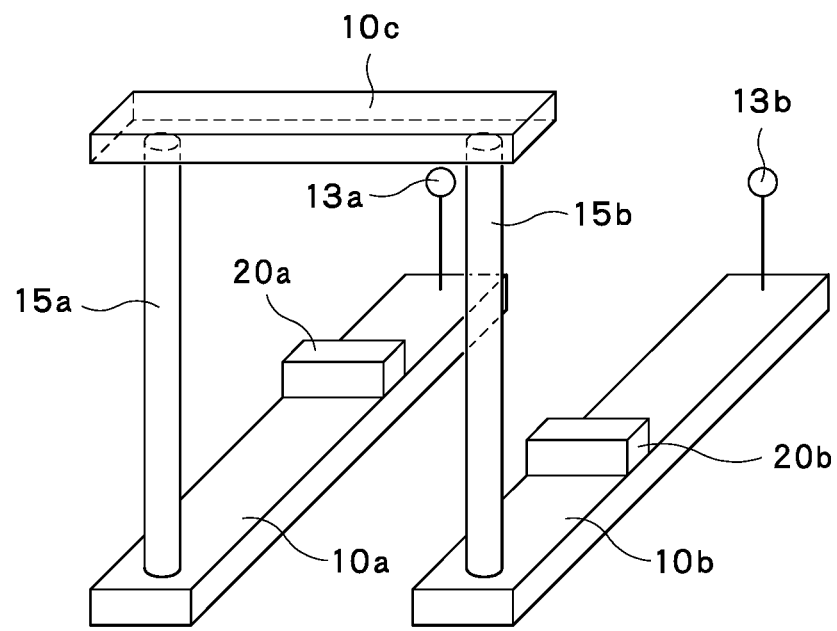
FIG. 18 is a perspective view of a memory cell included in a magnetic memory according to a sixth embodiment.

A magnetic memory according to a sixth embodiment will be described with reference to FIG. 18. The magnetic memory according to the sixth embodiment has at least one memory cell, which is shown in FIG. 18. The memory cell 1 according to the sixth embodiment is obtained by connecting the conductive layer 10c through a contact 15a to the conductive layer 10a and through a contact 15b to the conductive layer 10b in the memory cell 1 according to the first embodiment or the second embodiment shown in FIG. 1. The conductive layer 10c thus is connected to an end (third region) of the conductive layer 10a through the contact 15a. The terminal 13a is electrically connected to the other end (first region) of the conductive layer 10a. The conductive layer 10c is also connected to an end (fourth region) of the conductive layer 10b through the contact 15b. The terminal 13b is electrically connected to the other end (sixth region) of the conductive layer 10b. Thus, the magnetoresistance device 20a is disposed in a region (second region) of the conductive layer 10a between the region (third region) connecting to the conductive layer 10c and the region (first region) connecting to the terminal 13a, and the magnetoresistance device 20b is disposed in a region (fifth region) of the conductive layer 10b between the region (fourth region) connecting to the conductive layer 10c and the region (sixth region) connecting to the terminal 13b.

The conductive layer 10c is on a level that is different from a level on which the conductive layer 10a and the conductive layer 10b are disposed, and fabricated through a process that is different from a process for fabricating the conductive layer 10a and the conductive layer 10b.

Since the conductive layer 10a and the conductive layer 10b have a linear shape, they are easily fabricated in this embodiment.

Unlike the configuration according to this embodiment, The conductive layer 10c and the contacts 15a and 15b may be disposed below the conductive layer 10a and the conductive layer 10b.

A plurality of magnetoresistance devices may be disposed on each of the conductive layer 10a and the conductive layer 10b, like the fifth embodiment.

According to the sixth embodiment, a write operation may be performed with small current due to the spin Hall effect, like the first embodiment.

Furthermore, according to the sixth embodiment, a write operation may be performed with small write current due to the spin Hall effect and the VCMA, like the second embodiment.

According to the sixth embodiment, a magnetic memory that performs a write operation and a read operation at a high speed with large write and read operation margins may be obtained.

The magnetic memory according to the sixth embodiment has a large operation margin and may achieve low power consumption.

The sixth embodiment may be applied the magnetic memories according to the modifications of the first embodiment shown in FIGS. 6 to 9.

Seventh Embodiment

Figure 19:
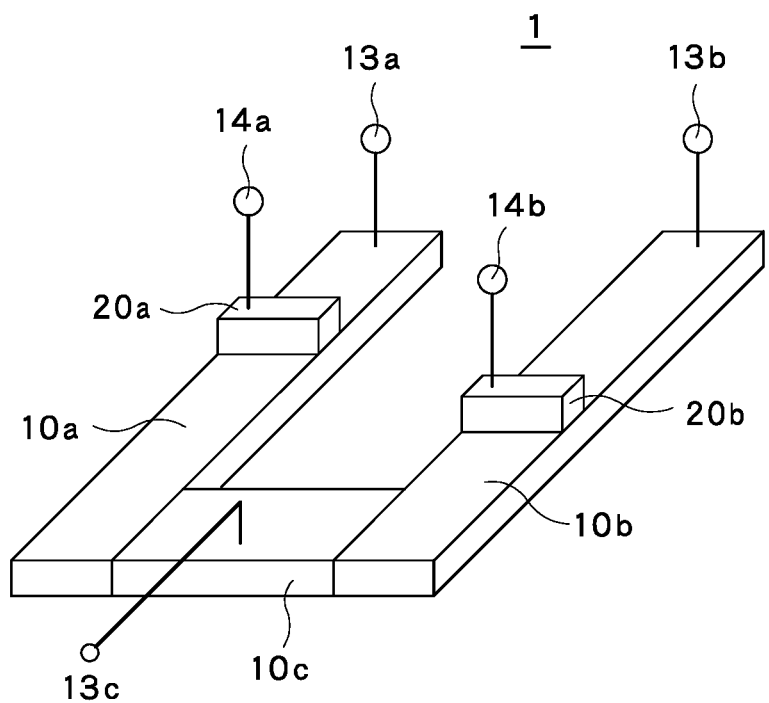
FIG. 19 is a perspective view illustrating a memory cell included in a magnetic memory according to a seventh embodiment.
Figure 20:
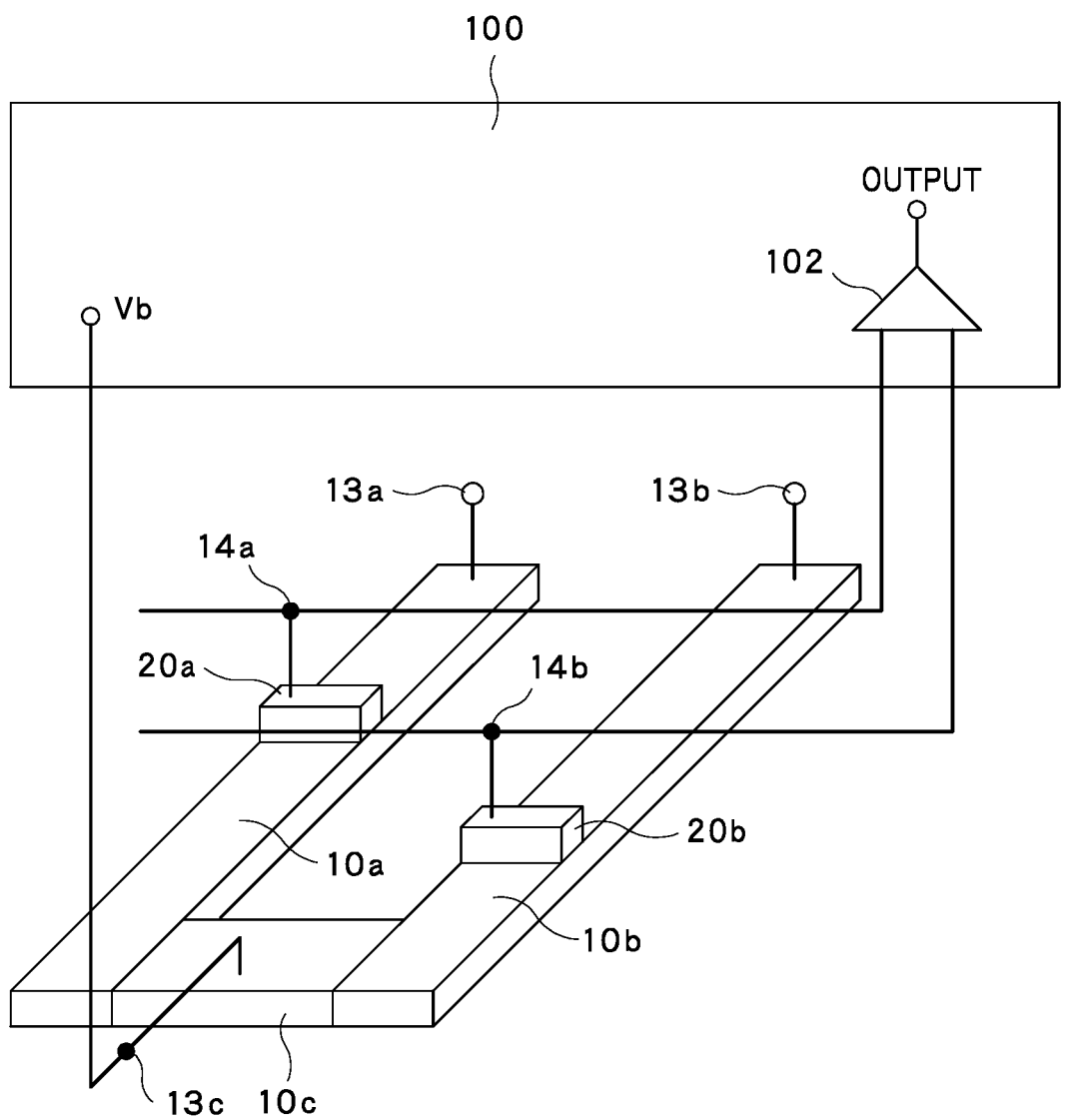
FIG. 20 is an explanatory diagram of a read operation for the magnetic memory according to the seventh embodiment.

A magnetic memory according to a seventh embodiment will be described with reference to FIGS. 19 and 20. The magnetic memory according to the seventh embodiment includes at least one memory cell, which is shown in FIG. 19. The memory cell 1 according to the seventh embodiment has a configuration obtained by newly disposing a terminal 13c connecting to the conductive layer 10c to the memory cell according to the first embodiment or the second embodiment shown in FIG. 1. The terminal 13c is electrically connected to the control circuit 100 shown in FIG. 1.

A write operation to write data to the magnetic memory according to the seventh embodiment is performed in the same manner as that of the first embodiment or the second embodiment. When the write current Iw flows through the conductive layers 10a, 10b, and 10c, the terminal 13c is connected to nowhere.

A read operation will be described with reference to FIG. 20. In the read operation, voltage Vb is applied between the terminal 13c and the terminal 14a, and between the terminal 13c and the terminal 14b, and differential voltage between the terminal 14a and the terminal 14b is read by means of the control circuit 100, as shown in FIG. 20. The read operation is performed in this manner. Although the voltage Vb is applied to the terminal 13c in FIG. 20, current may be supplied between the terminal 13c and the terminal 14a and between the terminal 13c and the terminal 14b.

Since variations in the resistance value of a switch connecting to the terminal 13c in this embodiment do not greatly affect the voltage difference between the terminal 14a and the terminal 14b, a large operation margin may be obtained in the read operation.

According to the seventh embodiment, a write operation may be performed with small write current due to the spin Hall effect, like the first embodiment.

Furthermore, according to the seventh embodiment, a write operation may be performed with small write current due to the spin Hall effect and the VCMA, like the second embodiment.

According to the seventh embodiment, a magnetic memory that performs a write operation and a read operation at a high speed with large write and read operation margins may be obtained.

The magnetic memory according to the seventh embodiment has a large operation margin and may achieve low power consumption.

The seventh embodiment may be applied to the magnetic memories according to the modifications of the first embodiment shown in FIGS. 6 to 9.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A magnetic memory comprising:
a first terminal and a second terminal;
a first conductive layer including a first region, a second region, and a third region that are arranged along a first direction, the second region being disposed between the first region and the third region, and the first region being electrically connected to the first terminal;
a second conductive layer including a fourth region, a fifth region, and a sixth region that are arranged along the first direction, the fifth region being disposed between the fourth region and the sixth region, and the sixth region being electrically connected to the second terminal;
a third conductive layer electrically connected to the third region and the fourth region;

a first magnetoresistance device disposed to correspond to the second region, including a first magnetic layer that is separate from the second region along a second direction intersecting the first direction, a second magnetic layer disposed between the second region and the first magnetic layer and electrically connected to the second region, a first nonmagnetic layer disposed between the first magnetic layer and the second magnetic layer, and a third terminal electrically connected to the first magnetic layer;

a second magnetoresistance device disposed to correspond to the fifth region, including a third magnetic layer that is separate from the fifth region along the second direction, a fourth magnetic layer disposed between the fifth region and the third magnetic layer and electrically connected to the fifth region, a second nonmagnetic layer disposed between the third magnetic layer and the fourth magnetic layer, and a fourth terminal electrically connected to the third magnetic layer; and a first circuit configured to flow a current between the first terminal and the second terminal through the first conductive layer, the third conductive layer, and the second conductive layer in a write operation, a direction from the first region to the third region differing from a direction from the fourth region to the sixth region, and a direction from the second magnetic layer to the fourth magnetic layer intersecting a plane including the first direction and the second direction.

2. The magnetic memory according to claim 1, wherein the first circuit applies a voltage to the third terminal and the fourth terminal in the write operation.

3. The magnetic memory according to claim 1, further comprising a second circuit configured to apply a voltage to at least one of the first terminal and the second terminal and to perform a read operation based on a voltage difference between the third terminal and the fourth terminal.

4. The magnetic memory according to claim 1, further comprising a fifth terminal electrically connected to the third conductive layer, and a second circuit configure to apply a voltage between the fifth terminal and the third terminal and between the fifth terminal and the fourth terminal and to perform a read operation based on a voltage difference between the third terminal and the fourth terminal.

5. The magnetic memory according to claim 1, wherein one of the first magnetoresistance device and the second magnetoresistance device is set to be in a high-resistance state, and the other is set to be in a low-resistance state.

6. The magnetic memory according to claim 1, further comprising a first magnetic-field-applying device configured to apply a biased magnetic field to the second magnetic layer, and a second magnetic-field-applying device configured to apply a biased magnetic field to the fourth magnetic layer.

7. The magnetic memory according to claim 6, wherein:
the first magnetic layer and the second magnetic layer have a magnetization component that intersects the second direction, and the third magnetic layer and the fourth magnetic layer have a magnetization component that intersects the second direction;
the first magnetic-field-applying device includes a fifth magnetic layer disposed between the first magnetic layer and the third terminal and having a magnetization component that is parallel to the second direction; and
the second magnetic-field-applying device includes a sixth magnetic layer disposed between the third magnetic layer and the fourth terminal and having a magnetization component that is parallel to the second direction.

8. The magnetic memory according to claim 6, wherein:
the first conductive layer includes a seventh region between the second region and the third region, and the second conductive layer includes a eighth region between the fifth region and the sixth region,
the first magnetic-field-applying device includes a fifth magnetic layer disposed to correspond to the seventh region, and
the second magnetic-field-applying device includes a sixth magnetic layer disposed to correspond to the eighth region.

9. The magnetic memory according to claim 1, wherein the third conductive layer is electrically connected to the third region through a first contact, and to the fourth region through a second contact.

10. The magnetic memory according to claim 1, further comprising: a first switch which is electrically connected to the first terminal, a second switch which is electrically connected to the third terminal, and a third switch which is electrically connected to the fourth terminal.

11. The magnetic memory according to claim 10, wherein the first switch, the second switch, and the third switch are MOS transistors.

12. The magnetic memory according to claim 10, further comprising: a fourth switch which is electrically connected to the second terminal.

* * * * *